(12) United States Patent
Sinangil et al.

(10) Patent No.: US 10,720,193 B2
(45) Date of Patent: Jul. 21, 2020

(54) TECHNIQUE TO LOWER SWITCHING POWER OF BIT-LINES BY ADIABATIC CHARGING OF SRAM MEMORIES

(71) Applicant: Apple Inc., Cupertino, CA (US)

(72) Inventors: Yildiz Sinangil, Sunnyvale, CA (US);
Mohamed H. Abu-Rahma, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/147,454

(22) Filed: Sep. 28, 2018

(65) Prior Publication Data

US 2020/0105321 A1 Apr. 2, 2020

(51) Int. Cl.
*G11C 5/14* (2006.01)
*G11C 7/12* (2006.01)
*G11C 5/06* (2006.01)
*G11C 11/419* (2006.01)

(52) U.S. Cl.
CPC ............... *G11C 7/12* (2013.01); *G11C 5/063* (2013.01); *G11C 5/147* (2013.01); *G11C 11/419* (2013.01)

(58) Field of Classification Search
CPC ........... G11C 7/12; G11C 5/063; G11C 5/147; G11C 11/419
USPC ........................................................ 365/226
See application file for complete search history.

(56) References Cited

U.S. PATENT DOCUMENTS

| 6,275,430 | B1 | 8/2001 | Ka |
| 7,463,531 | B2 | 12/2008 | Hemink et al. |
| 7,808,852 | B2 | 10/2010 | Yang et al. |
| 8,351,274 | B2 | 1/2013 | Ha et al. |
| 8,947,963 | B2 | 2/2015 | McCombs |
| 2004/0081009 | A1 | 4/2004 | Mangyo et al. |
| 2007/0230262 | A1 | 10/2007 | Origasa |
| 2008/0181038 | A1 | 7/2008 | Clinton |
| 2012/0033489 | A1 | 2/2012 | Song et al. |
| 2016/0027495 | A1* | 1/2016 | Kim .................... G11C 11/4074 365/149 |

\* cited by examiner

*Primary Examiner* — Huan Hoang
(74) *Attorney, Agent, or Firm* — Kowert, Hood, Munyon, Rankin & Goetzel, P.C.; Rory D. Rankin (57) ABSTRACT

A system and method for efficiently managing switching power of bit lines. In various embodiments, a first bit line in a memory array is pre-charged in multiple discrete steps, rather than in one continuous step. For a read operation that completed and read a logic low level from a first storage node, the first bit line is pre-charged from a ground reference level to a first power supply voltage. Similarly, a second bit line corresponding to a second storage node storing an inverse voltage level of the first storage node is pre-charged from a larger second power supply voltage to the smaller first power supply voltage. When the first time interval has elapsed, the first and second bit lines are pre-charged from the first power supply voltage to the second power supply voltage during a second time interval. Discrete steps are also used for pre-charging after write operations.

20 Claims, 5 Drawing Sheets

TECHNIQUE TO LOWER SWITCHING POWER OF BIT-LINES BY ADIABATIC CHARGING OF SRAM MEMORIES

BACKGROUND

Technical Field

Embodiments described herein relate to the field of computing systems and, more particularly, to efficiently managing switching power of bit lines.

Description of the Related Art

Generally speaking, a variety of computing systems include one or more processors and a memory, and the processors generate access requests for instructions, application data, and intermediate result data while processing one or more software applications. The one or more processors include a central processing unit (CPU), data parallel processors like graphics processing units (GPUs), digital signal processors (DSPs), and so forth. When fetching instructions and data, the processors check a hierarchy of local cache memories. Static random access memory (SRAM) is commonly used for the memory.

The SRAM includes an array of many bit cells and a logic portion used for accessing values stored in the array. The SRAM typically uses two power supply voltage levels, one for the bit cells in the array and one for the periphery logic. In addition, sometimes negative voltage levels are used in the array on bit lines during write operations. One of the two bit lines for a column or bit slice in the array is discharged during a read or a write operation. The pre-charging of the bit lines after read operations and write operations consume an appreciable amount of power. For example, the discharged bit line is pre-charged from either a negative voltage level or a ground reference voltage level to the array power supply voltage. Typically, the array power supply voltage is greater than the periphery power supply voltage. In fact, the pre-charging of the bit lines contributes a quarter to a half of the switching power consumption in the SRAM.

In view of the above, methods and mechanisms for efficiently managing switching power of bit lines are desired.

SUMMARY

Systems and methods for efficiently managing switching power of bit lines are contemplated. In various embodiments, a computing system includes at least one processor and a memory. In some embodiments, the memory is one level of a multi-level cache hierarchy, and each one of the memory bit cells is a copied variation of a static random access memory (SRAM) cell. In various embodiments, the memory comprises one or more arrays, each including multiple storage nodes for storing data. In addition, the memory includes periphery logic such as row decoders, column decoders and latches for read data and write data. Row decoders select the memory line to be accessed based on a received request address. Write data is driven from write latches into the array and written into a portion of the selected row. The portion is selected by column decoders. In various embodiments, the periphery logic uses a first power supply voltage, which is also referred to as the periphery voltage or VPER. The one or more arrays use a second power supply voltage, which is also referred to as the SRAM voltage or VSRAM. VSRAM is greater than VPER.

Signals, such as write data, read data, write and read enable signals, and so on, in the periphery logic use the voltage VPER to indicate a Boolean logic high level. A Boolean logic high level is also referred to as a binary logic high level, or simply a logic high level. Similarly, a Boolean logic low level is also referred to as a binary logic low level or a logic low level. In various embodiments, the periphery logic includes level-shifting circuitry for shifting a logic high level of at least write data from the voltage VPER to the larger voltage VSRAM used by the memory array.

A first storage node in an array of the one more arrays stores a positive, non-zero voltage level using the voltage VSRAM. In one example, the first storage node stores a logic low value, whereas, a second storage node stores the logical inverse of the voltage level stored on the first storage node. Therefore, the second storage node stores a positive, non-zero voltage level using the voltage VSRAM. In an embodiment, back-to-back inverters are used to maintain the voltage levels on each of the first storage node and the second storage node. Upon completion of an access operation accessing the first storage node, such as a read operation that reads a logic low level or a write operation that wrote a logic low level, a first bit line corresponding to the first storage node is pre-charged to a logic high level.

The first bit line is pre-charged in discrete steps, rather than in one continuous step. The first bit line is pre-charged to the voltage VPER during a first time interval. For a read operation that completed and read a logic low level from the first storage node, the first bit line is pre-charged from the ground reference level to the voltage VPER. When the first time interval has elapsed, the first bit line is pre-charged from the voltage VPER to the larger voltage VSRAM during a second time interval. The power consumed to pre-charge the first bit line from the ground reference level to the voltage VSRAM in two discrete steps is less than the power consumed to use one continuous step for pre-charging. The latency grows by using two discrete steps. However, typically, the SRAM cells in the array do not set the chip maximum clock frequency such as when VSRAM is greater than VPER. Rather, timing paths in the processor circuitry using the first power supply voltage typically set the maximum clock frequency.

During the first time interval after a read operation when the first bit line is pre-charged from the ground reference level to the voltage VPER, a second bit line corresponding to the second storage node is also pre-charged from the larger voltage VSRAM to the voltage VPER. Therefore, the second bit line is actually discharged, since the voltage VSRAM is greater than the voltage VPER. Since it is unknown which of the first storage node and the second storage node stores a logic low level before completion of the read operation, both the first bit line and the second bit line are pre-charged after each read operation. During the second time interval, each of the first bit line and the second bit line is pre-charged from the voltage VPER to the larger voltage VSRAM.

The first bit line is also pre-charged in discrete steps after write operations complete, rather than in one continuous step. In various embodiments, a negative voltage level is used to represent a logic low level for write operations. In such cases, for a write operation that completed and wrote a logic low level on the first storage node, the first bit line is pre-charged from a negative voltage level to the ground reference level during a third time interval prior to the above first time interval. Afterward, the pre-charge of the first bit line continues with the two steps described above for the read operation such as the pre-charge during the first time interval followed by the pre-charge during the second time interval. Therefore, the read operation uses two discrete steps to pre-charge the first bit line, and the write operation uses three discrete steps to pre-charge the first bit line.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
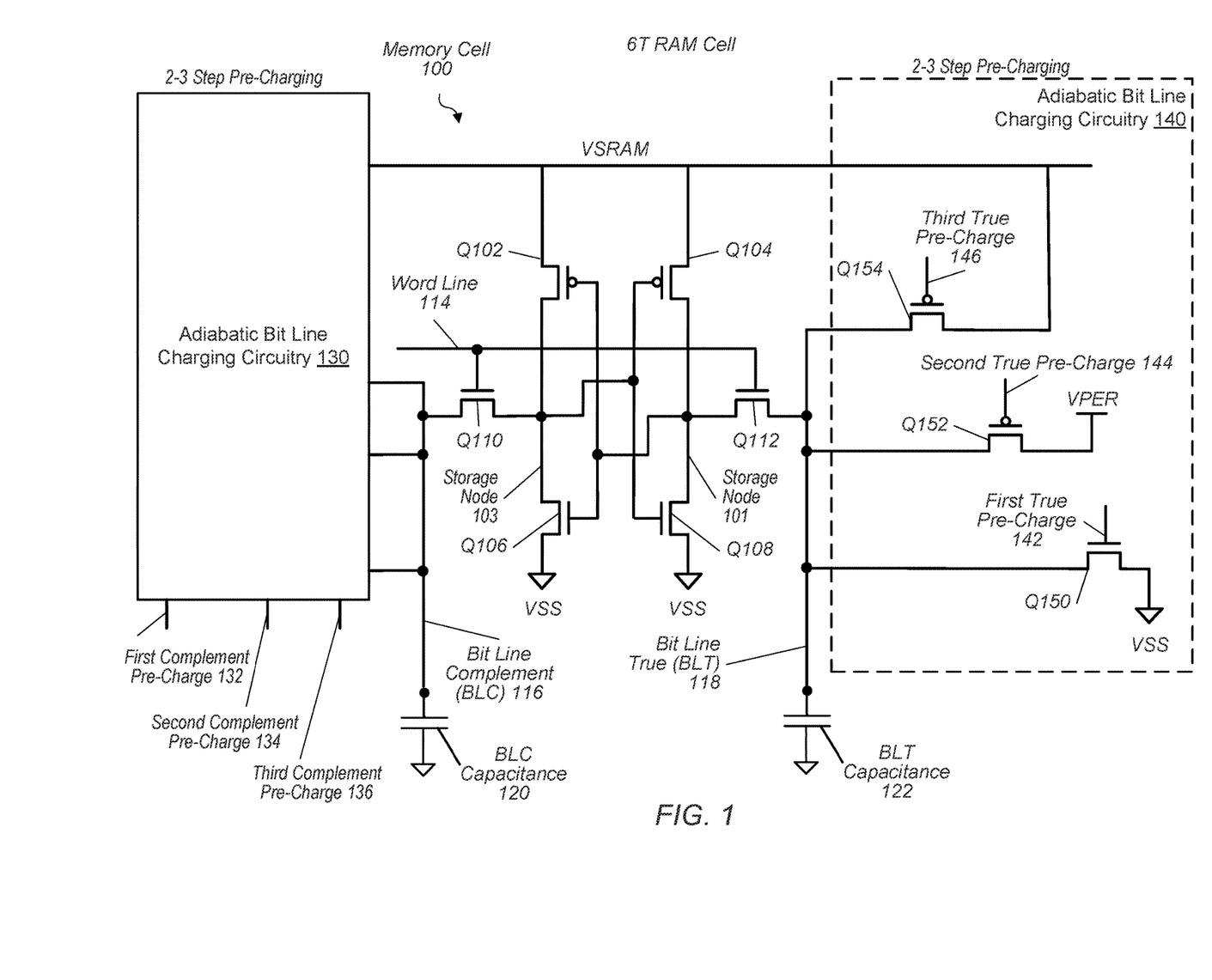
FIG. 1 is a generalized diagram of one embodiment of a memory macro cell.

Turning to FIG. 1, one embodiment of a memory cell 100 used for storing data and providing access to the data is shown. In the illustrated embodiment, memory cell 100 uses a variation of the six-transistor (6T) RAM cell for data storage. The memory cell 100 utilizes devices Q102, Q104, Q106 and Q108, which are also referred to as devices Q102-Q108, as a latching element. The latching element stores data on storage nodes 101 and 103. When the devices Q110 and Q112 are enabled by the word line input 114, the latching element has access to the bit line complement (BLC) 116 (or bit line 116) and bit line true (BLT) 118 (or bit line 118). When resolved, each of the storage nodes 101 and 103 stores a voltage level that is a complementary voltage level of the other storage node. For example, when storage node 101 stores a logic high level, the storage node 103 stores a logic low level, and vice-versa.

Many times, such as after a read access operation (or read operation) or a write access operation (or write operation) completes, each of the bit lines 116 and 118 stores a voltage level that is a complementary voltage level of the other bit line. However, after pre-charging has completed, each of the bit lines 116 and 118 stores a same logic high level. When the devices Q102-Q108 of the latching element resolve the voltage level (data value) on the storage nodes 101 and 103, the devices Q102-Q108 do not consume power besides leakage current power.

As described below in more detail, to store voltage levels on the storage nodes 101 and 103 in the latching element of memory cell 100 in addition to pre-charging and discharging the bit lines 116 and 118, memory cell 100 uses devices Q102-Q112, which are enabled and disabled at particular times. Additionally, memory cell 100 uses devices included in the adiabatic bit line pre-charging circuitry 130 (or circuitry 130) and 140 for pre-charging the bit lines 116 and 118. For example, in the illustrated embodiment, logic 140 includes devices Q150, Q152 and Q154.

As used herein, a "device" refers to a resistor, a transistor, or other suitable type of transconductance device coupled between a circuit node and either a power node or a ground node. In addition, as used herein, a "logic low level," a "logic 0 value," or a "Boolean logic low level" corresponds to a voltage level sufficiently low to enable a p-type metal oxide semiconductor (MOS) field effect transistor (FET), which is also referred simply as a "pfet." Similarly, a "logic high level," a "logic 1 value," or a "Boolean logic high level" corresponds to a voltage level sufficiently high to enable an n-type metal oxide semiconductor (MOS) field effect transistor (FET), which is also referred simply as an "nfet." In various other embodiments, different technology, including technologies other than complementary metal-oxide semiconductor (CMOS), result in different voltage levels for "low" and "high."

The data stored by the devices Q102-Q108 of the latching element included in the memory cell 100 are gated from the bit lines 116 and 118 by the devices (nfets) 110 and 112. The devices (nfets) 110 and 112 continue to block the stored data on the storage nodes 101 and 103 from the bit lines 116 and 118 until the word line input 114 is enabled by external access logic. The bit lines 116 and 118 are pre-charged by logic 130 and 140, respectively. In various embodiments, the memory cell 100 is copied many times and arranged in an array of rows and columns for a memory. Accordingly, each of the bit lines 116 and 118 has an associated capacitance due to other memory cells in a same column. As shown, bit line 116 is connected to the bit line complement (BLC) capacitance 120, which models the capacitive loading of the other memory cells in the same column. In a similar manner, bit line true (BLT) capacitance 122 is connected to bit line 118.

As shown, the devices Q102-Q112 use the power supply voltage "VSRAM" to set a logic high level and use the ground reference voltage "VSS" to set the logic low level. In various embodiments, circuitry 130 incorporates the same circuitry as circuitry 140. As shown, each of circuitry 130 and 140 uses the power supply voltage "VPER" a logic high level and use the ground reference voltage "VSS" to set the logic low level. In various embodiments, the voltage VSRAM is greater than the voltage VPER. In various embodiments, the voltage VPER is also used by external circuitry such as row decoders, column decoders, and so on. In some embodiments, a processor, which generates access requests to be serviced by a memory using multiple instantiations of the memory cell 100, also uses the voltage VPER.

Circuits connected to a common power supply voltage at a particular voltage level are referred to as belonging to the same "power domain" or "voltage domain." In cases where the two power domains employ different power supply voltage levels, such as the voltage VSRAM is appreciably different from (and greater than) the voltage VPER, voltage levels of the transmitted data and control signals are adjusted (in a process commonly referred to as "level shifting") so the data and control signals are compatible with the receiving circuit. Level shifting circuitry (or level shifters) are located externally from the memory cell 100.

It is noted that although the memory cell 100 is shown as a single ported memory cell, in other embodiments, the memory cell 100 uses a multi-port design to provide parallel access operations for improved performance. In various embodiments, the memory cell 100 includes external logic (not shown) such as row decoders, column decoders and a sense amplifier.

The word line 114 is used to enable the devices (nfets) 110 and 112. The word line 114 is also connected to other 6T RAM cells of other memory cells in a corresponding row of the array. A row decoder (not shown) receives address information and enables a single row word line of many row word lines. When the address information indicates the word line 114 is to be enabled, the devices (nfets) 110 and 112 of each 6T RAM cell in the row are enabled and provide access for the devices Q102-Q108 of the latching element to the bit lines 116 and 118.

The devices Q102-Q108 of the latching element amplify any voltage difference detected between the differential voltages on the bit lines 116 and 118 and resolve these voltages to full swing voltage levels. The bit lines 116 and 118 are routed throughout a respective column of the array. In some embodiments, the bit lines 116 and 118 are also inputs to a sense amplifier (not shown) and read latches (not shown). In other embodiments, the bit lines 116 and 118 are inputs to dynamic logic. In addition, the bit lines 116 and 118 are connected to circuitry 130 and 140, respectively, for pre-charging.

For read access operations, the external sense amplifier is enabled, the external read latches are enabled, and pre-charge devices are disabled. For example, each of the devices Q150 (an nfet), Q152 (a pfet) and Q154 (a pfet) is disabled. Therefore, the devices Q102-Q108 of the latching element are permitted to resolve the differential voltages on the bit lines 116 and 118 to full voltage swing values. For write access operations, a column decoder and write logic (not shown) select columns of the array and set voltage levels onto the bit lines 116 and 118 routed throughout a selected column in addition to disabling devices in circuitry 130 and 140.

In the illustrated embodiment, the first true pre-charge 142 (or pre-charge 142) in circuitry 140 controls whether device Q150 is enabled or disabled. Similarly, the second true pre-charge 144 (or pre-charge 144) controls whether device Q152 is enabled or disabled, and the third true pre-charge 146 (or pre-charge 146) controls whether device Q154 is enabled or disabled. In various embodiments, only one of the devices Q150, Q152 and Q154 is enabled at a given time, although each of them are capable of being disabled at a same time. The circuitry 130 receives the signals first complement pre-charge 132 (or pre-charge 132), second complement pre-charge 134 (or pre-charge 134), and third complement pre-charge 136 (or pre-charge 136) for enabling and disabling devices included in circuitry 130.

Taking storage node 101 as an example, upon completion of an access operation, such as a read operation that read a logic low level from storage node 101 or a write operation that wrote a logic low level on storage node 101, bit line 118 is pre-charged using multiple steps to a logic high level using the voltage VSRAM. Multiple discrete steps are used, rather than one continuous step, to pre-charge bit line 118 using adiabatic charging. Beginning with an example for the completion of a write operation, bit line 118 is pre-charged from a negative voltage level referred to as "VNBL" (not shown) to the ground reference voltage VSS during a first time interval. In some embodiments, the negative voltage supply VNBL is used for write operations. During the first time interval, pre-charge 142 is set at a logic high level to enable Q150 and bit line 118 is set at or near the ground reference voltage VSS.

Bit line 116 was used to write a logic high level on storage node 103 during the write operation, so it still stores the logic high level using the voltage VSRAM. Accordingly, bit line 116 does not need pre-charging. Therefore, devices included in circuitry 130 are disabled via pre-charge signals 132, 134 and 136. Control logic identifies based on the write data and before completion of the write operation which one of the bit lines 116 and 118 stores the logic low level using the voltage VNBL and needs subsequent pre-charging.

After the first time interval elapses, bit line 118 is pre-charged from the ground reference voltage VSS to the voltage VPER during a second time interval. Device 150 is disabled (and device 154 is also disabled) while device 152 is enabled. Pre-charge 142 is set at a logic low level to disable device 150 while pre-charge 144 is set at a logic low level to enable device Q152. Device 152 is used to connect bit line 118 to the voltage VPER.

After the second time interval elapses, bit line 118 is pre-charged from the voltage VPER to the larger voltage VSRAM during a third time interval. During the third time interval, each of the devices 150 and 152 is disabled while device 154 is enabled. Pre-charge 142 is set at a logic low level to disable device Q150 and pre-charge 144 is set at a logic high level to disable device Q152. Pre-charge 146 is set at a logic low level to enable Q154. Device 154 is used to connect bit line 118 to the voltage SRAM.

In various embodiments, each of the first time interval, the second time interval and the third time interval are values stored in a programmable register used to generate the pre-charge signals 142, 144 and 146. For example, in one embodiment, a Boolean AND gate receives a clock signal with a smaller clock period than a clock signal used to enable write word line 114. In addition, control logic uses a count stored in the programmable register to determine when to enable pre-charging and sends an output to the AND gate. In some embodiments, one or more of the first time interval, the second time interval and the third time interval have same time duration.

The power consumed to pre-charge bit line 118 from the voltage VNBL to the voltage VSRAM in three discrete steps is less than the power consumed to use one continuous step for pre-charging bit line 118. The latency for pre-charging bit line 118 grows by using three discrete steps, but typically, the memory cells in an array do not set the chip maximum clock frequency. Using the three discrete steps uses power supply voltages, such as VSRAM, VPER, VSS and VNBL, which were already routed to memory cell 100.

Turning now to an example for the completion of a read operation, bit line 118 is pre-charged from the ground reference voltage VSS to the voltage VPER ground reference voltage VSS during a fourth time interval. At the same time, bit line 116 is pre-charged from the voltage VSRAM to the voltage VPER. Since the voltage VSRAM is greater than the voltage VPER, bit line 116 is actually discharged. In other words, the two bit lines BLC 116 and BLT 118 are charge sharing during this period through VPER. Since it is unknown which of the two storage nodes 101 and 103 stores a logic low level before completion of the read operation, both the bit line 116 and the bit line 118 are pre-charged after each read operation.

During the fourth time interval, device Q150 is disabled (and device Q154 is also disabled) while device Q152 is enabled. Pre-charge 142 is set at a logic low level to disable device Q150 while pre-charge 144 is set at a logic low level to enable device Q152. Device Q152 is used to connect bit line 118 to the voltage VPER. Similarly, pre-charge 132 is set at a logic low level to disable a corresponding device (an nfet) while pre-charge 134 is set at a logic low level to enable a corresponding device (a pfet) in circuitry 130. The enabled device in circuitry 130 is used to connect bit line 116 to the voltage VPER.

After the fourth time interval elapses, bit line 118 is pre-charged from the voltage VPER to the larger voltage VSRAM during a fifth time interval. During the fifth time interval, each of the devices 150 and 152 is disabled while device 154 is enabled. Pre-charge 142 is set at a logic low level to disable device Q150 and pre-charge 144 is set at a logic high level to disable device Q152. Pre-charge 146 is set at a logic low level to enable Q154. Device 154 is used to connect bit line 118 to the voltage SRAM. Similarly, pre-charge 132 is set at a logic low level to disable a corresponding device (an nfet) and pre-charge 134 is set at a logic high level to disable a corresponding device (a pfet) while pre-charge 136 is set at a logic low level to enable a corresponding device (a pfet) in circuitry 130. The enabled device in circuitry 130 is used to connect bit line 116 to the voltage VSRAM.

In various embodiments, each of the fourth time interval and the fifth time interval are values set as described earlier for the first through third time intervals. The power consumed to pre-charge bit lines 116 and 118 from the voltage VSS to the voltage VSRAM in two discrete steps is less than the power consumed to use one continuous step for pre-charging bit line 118. Using the above three discrete steps for pre-charging after a write operation and the discrete two steps for pre-charging after a read operation takes advantage of adiabatic charging. When using one continuous step for pre-charging bit line 118, such as using a single device that is enabled for the entire duration of pre-charging, the energy dissipated is equivalent to the expression $C \times VSRAM^2$, where C is the capacitance 122. Using the multiple discrete steps as described above, the energy dissipation is reduced from the expression $C \times VSRAM^2$.

Taking a general example, charging a capacitance of C with a voltage of ($2 \times VDD$) dissipates, through a supply voltage of $2 \times VDD$, an amount of energy equivalent to the expression $4 \times C \times VDD^2$. However, charging the same capacitance, C, in a first discrete step from a ground reference voltage VSS, or 0V, to a voltage less than ($2 \times VDD$), such as ($1 \times VDD$), dissipates, through a supply voltage of VDD, an amount of energy equivalent to the expression $1 \times C \times VDD^2$. Next, charging this capacitance, C, which is already charged to the voltage ($1 \times VDD$) to a higher voltage, such as ($2 \times VDD$), dissipates an amount of energy equivalent to the expression $2 \times C \times VDD^2$. The total energy dissipated is the sum, which is $3 \times C \times VDD^2$. Using adiabatic charging in two discrete steps provides an energy savings of 25% in this general example. Different energy savings are achieved when the number of discrete steps varies and the voltage levels of the intermediate voltages used during these discrete steps varies. However, the overall energy dissipation still reduces when compared to charging the capacitative load in a single step.

Figure 2:
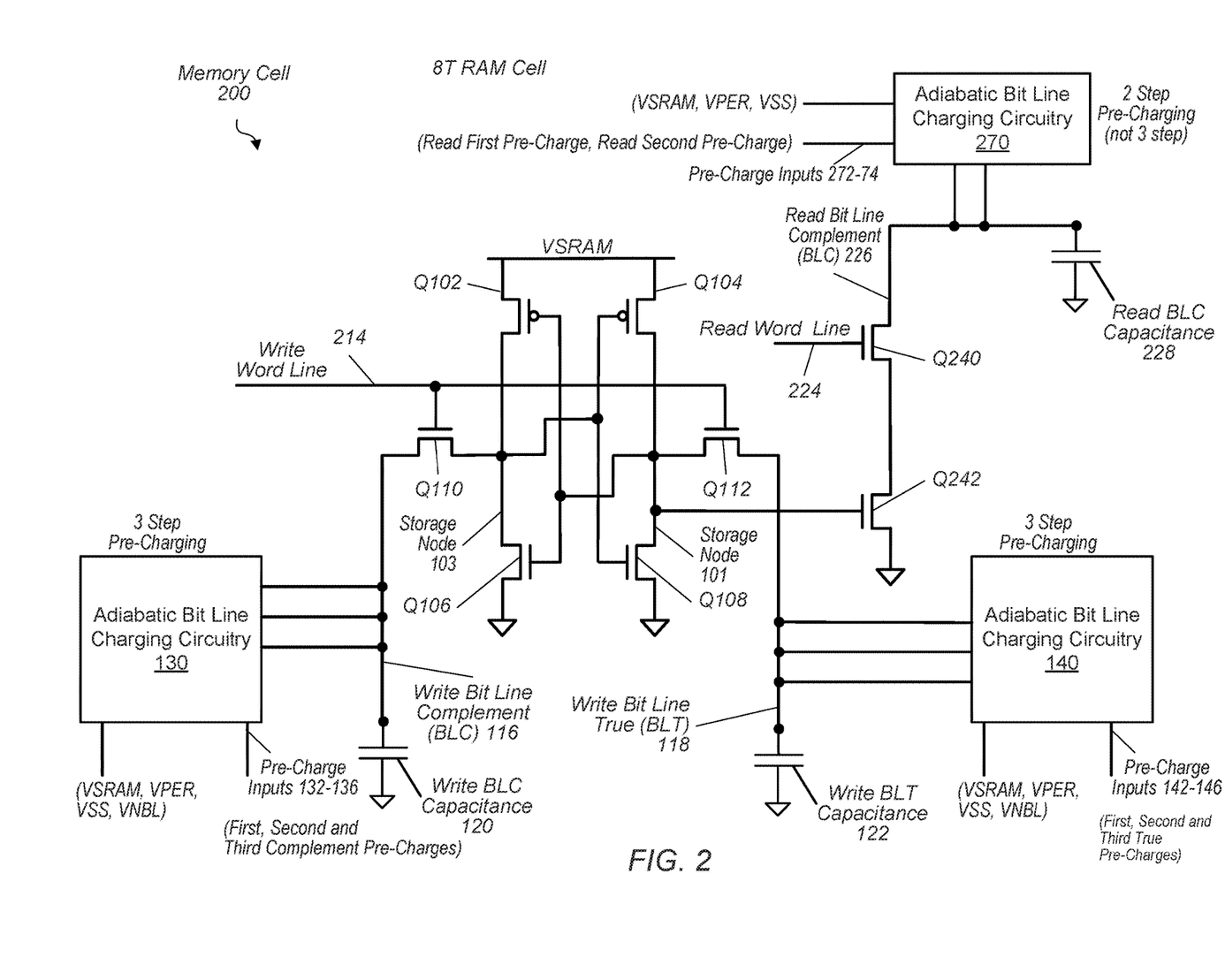
FIG. 2 is a generalized diagram of another embodiment of a memory macro cell.

Referring now to FIG. 2, another embodiment of a memory cell 200 used for storing data and providing access to the data is shown. Circuitry and logic described earlier are numbered identically. The read and write operations are separated by adding the stack of devices Q240 and Q242. The 8T memory cell 300 has an on-die area penalty over the previous 6T memory cell 100 described earlier due to the devices Q240 and Q242, the extra routes for the read word line 224 and the read complement bit line 226, which is connected to the capacitor 228 modeling the connections to other cells in a same column. However, the 8T memory macro cell 300 operates with higher stability at lower power supply values in comparison with the 6T memory cell 100.

The stability of the memory cell 200 is improved over the earlier memory macro cell 200 by isolating the current drawn by a read operation from a data storage node among the devices Q102-Q108 of the latching element. The read and write operations are controlled by the separate write word line 214 and read word line 224. Although two examples of memory cells are shown in FIGS. 1-2, any variation of a random access memory (RAM) cell is selected based on design needs. In other memory cell designs, one or more of the number of bit lines, the number of word lines and the number of transistors is modified.

When the devices Q110 and Q112 are enabled by the write word line input 214, the latching element has access to the bit line complement (BLC) 116 (or bit line 116) and bit line true (BLT) 118 (or bit line 118). When resolved, each of the storage nodes 101 and 103 stores a voltage level that is a complementary voltage level of the other storage node. When the device Q240 is enabled by the read word line input 224 and the device Q242 is enabled by the storage node 101, the bit line 226 is discharged. As shown, bit line 116 is pre-charged by circuitry 130 and bit line 118 is pre-charged by circuitry 140 as described earlier. However, now, bit lines 116 and 118 are pre-charged only after completed write operations. Bit line 226 is pre-charged by circuitry 270 after completed read operations. Circuitry 270 receives the same voltage levels as circuitry 130 and 140, except circuitry 270 does not use the negative voltage level VNBL.

Circuitry 270 also receives the pre-charge signals 272-274 for enabling and disabling corresponding devices. Since circuitry 270 uses two discrete steps for pre-charging after completed read operations, only two pre-charge signals are used. In an embodiment, circuitry 270 includes two pfets, one connected to the voltage VPER and another connected to VSRAM in a similar manner as shown earlier for devices Q152 and Q154 (of FIG. 1). Although circuitry 130 and 140 are shown to use 3 discrete steps and circuitry 270 is shown to use 2 discrete steps for pre-charging, in other embodiments, another number of discrete steps and time intervals are used as well as another number of pre-charge signals.

Figure 3:
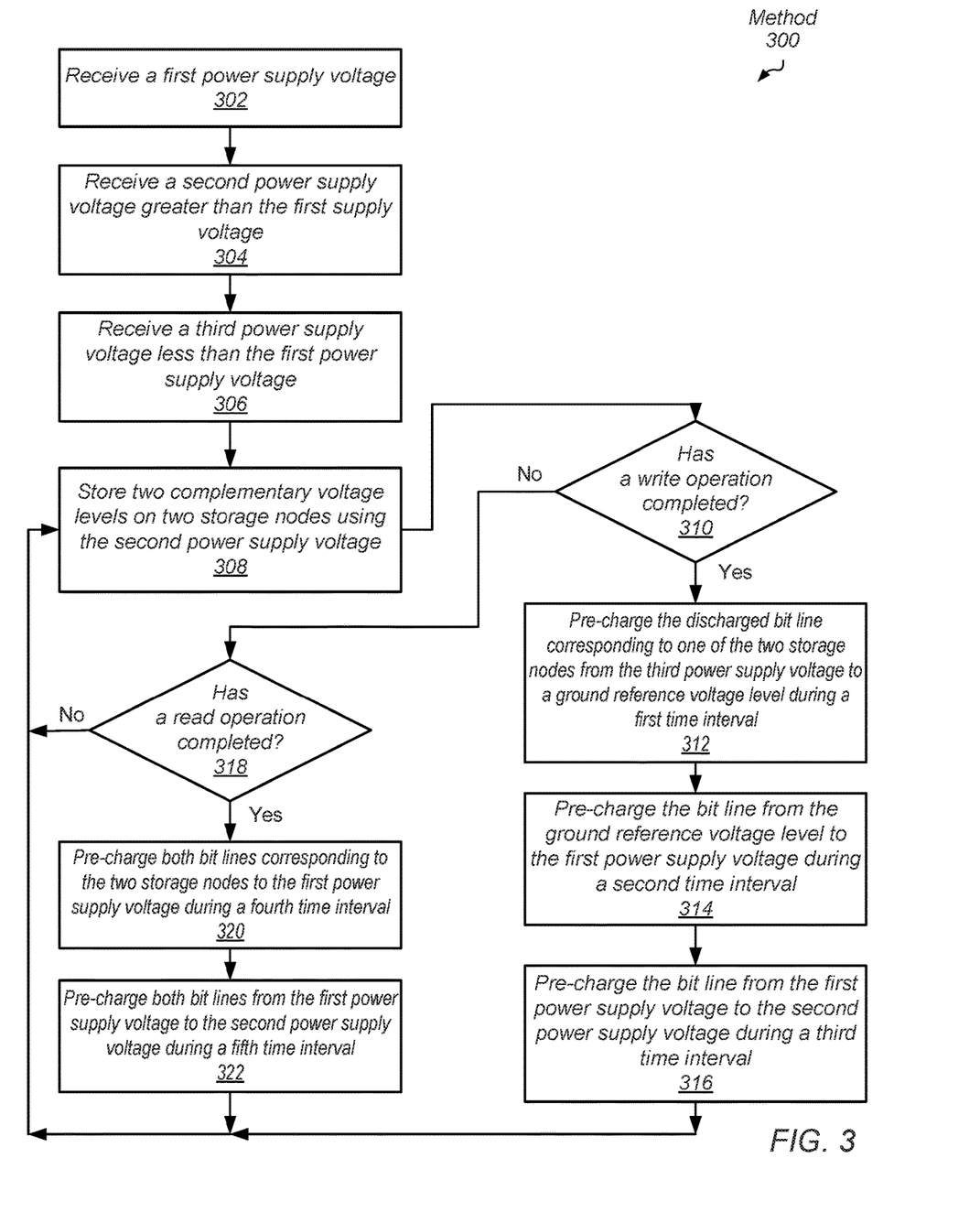
FIG. 3 is a flow diagram of one embodiment of a method for managing switching power of bit lines.

Referring now to FIG. 3, a generalized flow diagram of one embodiment of a method 300 for efficiently managing switching power of bit lines is shown. For purposes of discussion, the steps in this embodiment are shown in sequential order. However, in other embodiments some steps may occur in a different order than shown, some steps may be performed concurrently, some steps may be combined with other steps, and some steps may be absent.

A first power supply voltage is received (block 302). In various embodiments, the first power supply voltage, which is also referred to as "VPER," is used by periphery logic in a memory. In some embodiments, the periphery logic includes word line drivers, row decoders, and column decoders and so on. In an embodiment, a processor, which accesses the memory, also uses the voltage VPER. In various embodiments, the voltage VPER is a positive, non-zero voltage.

A second power supply voltage greater than the first supply voltage is received (block 304). In various embodiments, the larger second power supply voltage, which is also referred to as "VSRAM," is used by cells within arrays of the memory. In an embodiment, each cell is an SRAM cell. A third power supply voltage less than the first power supply voltage is received (block 306). In some embodiments, the third power supply voltage is a negative power supply voltage. The third power supply voltage is also referred to as "VNBL."

Two complementary voltage levels are stored on two storage nodes using the voltage VSRAM (block 308). Each of the two voltage levels is a binary logical inverse of the other. In an embodiment, back-to-back inverters are used to maintain the two complementary voltage levels on two storage nodes of a SRAM cell. If a write operation has completed ("yes" branch of the conditional block 310), then the discharged bit line, which corresponds to the storage node written with a logic low level, is pre-charged from the voltage VNBL to a ground reference voltage level during a first time interval (block 312). In some embodiments, a negative voltage supply is used for write operations. During the first time interval, the discharged bit line is returned to the ground reference voltage level. The other bit line was used to write a logic high level, so it still stores the logic high level using the voltage VSRAM. Control logic identifies based on the write data and before completion of the write operation which bit line stores the logic low level using VNBL and needs subsequent pre-charging.

After the first time interval elapses, the bit line is pre-charged from the ground reference voltage level to the voltage VPER during a second time interval (block 314). In some embodiments, a first device, such as an nfet, is enabled for pre-charging the bit line from the voltage VNBL to the ground reference voltage level during the first time interval. During the second time interval, the first device is disabled while a second device, such as a pfet, is enabled for pre-charging the bit line from the ground reference voltage level to the voltage VNBL.

After the second time interval elapses, the bit line is pre-charged from the voltage VPER to the larger voltage VSRAM during a third time interval (block 316). In some embodiments, during the third time interval, each of the first device and the second device is disabled while a third device, such as another pfet, is enabled for pre-charging the bit line from the voltage VPER to the larger voltage VSRAM. Afterward, control flow of method 300 returns to block 308 where two complementary voltage levels are stored on two storage nodes using the voltage VSRAM.

If a write operation has not completed ("no" branch of the conditional block 310), and a read operation has not completed ("no" branch of the conditional block 318), then control flow of method 300 returns to block 308 where two complementary voltage levels are stored on two storage nodes using the voltage VSRAM. However, if a write operation has not completed ("no" branch of the conditional block 310), and a read operation has completed ("yes" branch of the conditional block 318), then both bit lines corresponding to the two storage nodes are pre-charged to the voltage VPER during a fourth time interval (block 320).

The bit line corresponding to the storage node storing the logical high level is also pre-charged from the larger voltage VSRAM to the voltage VPER. Therefore, this bit line is actually discharged, since the voltage VSRAM is greater than the voltage VPER. Since it is unknown which one of the two storage nodes stores a logic low level before completion of the read operation, both bit lines are pre-charged after each read operation. In some embodiments, the same second device (a pfet) used earlier is enabled for pre-charging one of the two bit lines to the voltage VPER. A fourth device, such as another pfet, is used to pre-charge the other bit line to the voltage VPER. In other embodiments, bit lines are not shared for read and write operations, so the earlier second device is not used, but rather, another device, such as another pfet, is used for pre-charging.

After the fourth time interval elapses, both bit lines are pre-charged from the voltage VPER to the larger voltage VSRAM voltage during a fifth time interval (block 322). In some embodiments, during the fifth time interval, each of the devices used during the fourth time interval are disabled while other devices are enabled for pre-charging the two bit lines from the voltage VPER to the larger voltage VSRAM. Afterward, control flow of method 300 returns to block 308 where two complementary voltage levels are stored on two storage nodes using the voltage VSRAM.

The power consumed to pre-charge a bit line from the ground reference level to the voltage VSRAM in three discrete steps after a write operation or in two discrete steps after a read operation is less than the power consumed to use one continuous step for pre-charging. The latency grows by using two, three, or more discrete steps, but typically, the array does not set the chip maximum clock frequency such as when VSRAM is greater than VPER. Rather, timing paths in the processor circuitry using the voltage VPER typically set the maximum clock frequency. In the above description, two discrete steps are described for pre-charging after a read operation and three discrete steps are described for pre-charging after a write operation. However, in other embodiments, another positive integer greater than one is used for the number of discrete steps used for pre-charging one or more of the two bit lines. Similarly, more power supply voltages are used in other embodiments.

Figure 4:
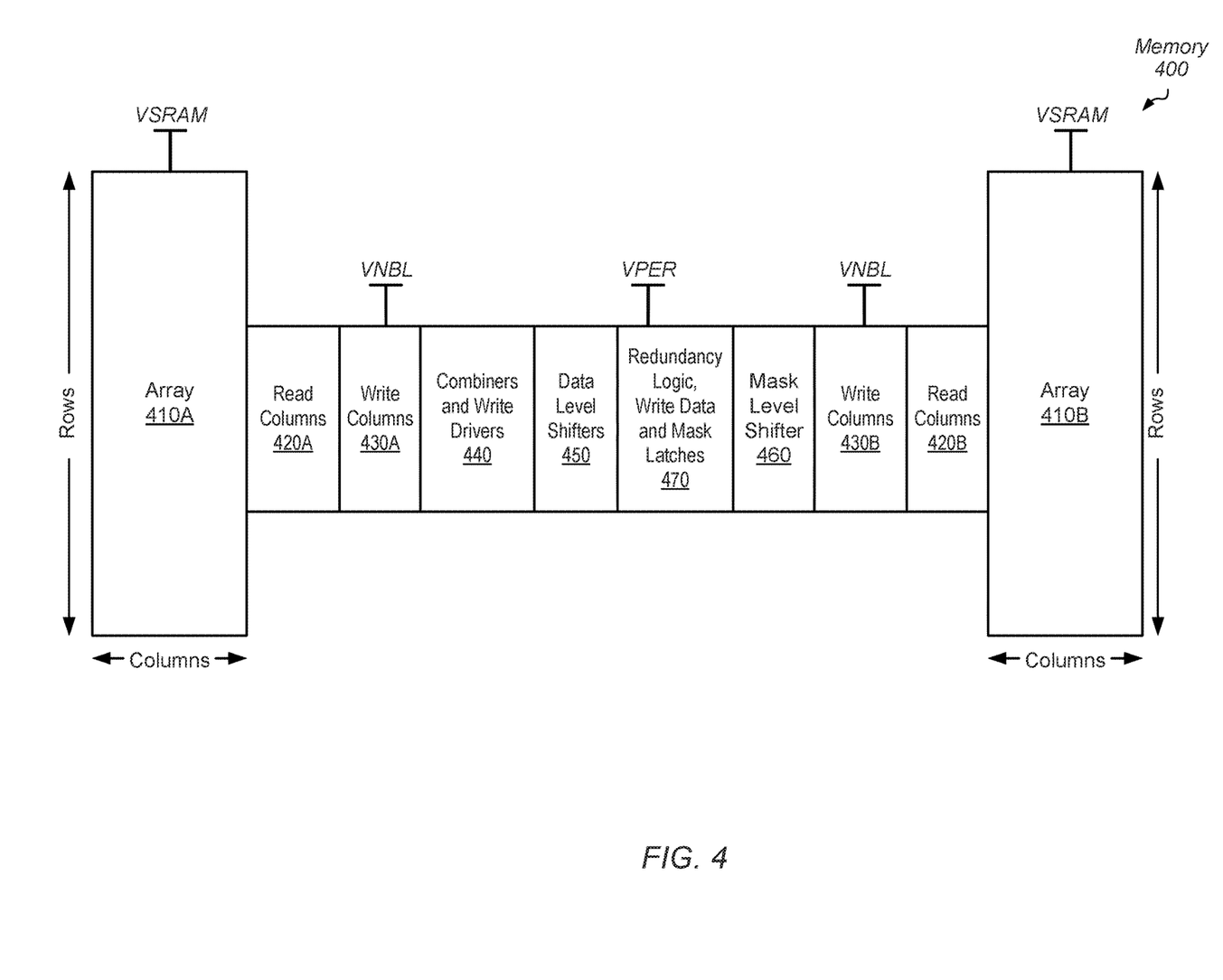
FIG. 4 is a block diagram of one embodiment of a memory.

Turning to FIG. 4, a generalized block diagram illustrating one embodiment of memory 400 is shown. In various embodiments, memory 400 comprises arrays 410A-410B, read columns 420A-420B, write columns 430A-430B, write drivers 440, data level shifters 450, mask level shifters 460 and latches 470 for write data and write mask data. The routing of received memory access requests and received control signals are not shown for ease of illustration. Similar to the memory arrays described earlier, in various embodiments, each of the arrays 410A-410B includes multiple memory bit cells arranged in a tiled format. In various embodiments, each one of the memory bit cells is a copied variation of an SRAM cell.

As shown, rows are placed in a vertical orientation in arrays 410A-410B and columns are placed in a horizontal orientation. However, the orientation of rows and columns may be switched in other embodiments. Rows may also be referred to as entries. In various embodiments, each row, or entry, stores data such as one or more memory lines. In addition, the orientation of blocks 420A-420B, 430A-430B and 440-470 may also be placed in a different orientation and/or a different location with respect to one another and with respect to arrays 410A-410B. In various embodiments, each of the blocks 420A-420B, 430A-430B and 440-470 is communicatively coupled to another one of the blocks. For example, direct connections are used wherein routing occurs through another block. Alternatively, staging of signals is done in an intermediate block.

In some embodiments, a row within the arrays 410A-410B is wider than input/output (I/O) data, which is received by memory 400 and sent by memory 400. For example, in one embodiment, a row within the arrays 410A-410B includes 456 bits, whereas the width of I/O data is 64 bits. Therefore, the arrays 410A-410B use a four-to-one selection logic, such as multiplexers, to access the correct portion of the 456-bit row.

In some embodiments, write operations target a finer granularity of data. In one embodiment, write operations are capable of targeting a single byte of data. Therefore, a write mask is used to specify which byte(s) of the eight bytes in the 64-bit I/O data are enabled for the write operation. The latches in block 470 receive the write data and the write mask data.

In various embodiments, memories use multiple power supply voltage domains to achieve both performance for memory accesses and lower power consumption for transferring data and control signals over relatively long distances. In an embodiment, memory 400 is a dual supply rail memory, which converts data and control signals using a first power supply voltage (VPER) to values using a second supply voltage (VSRAM) which is greater than the first supply voltage. Blocks 450 and 460 convert (level shift) at least the write data and the write mask data from the first supply voltage to the second supply voltage. In an embodiment, arrays 410A-410B and blocks 420A-420B, 430A-430B and 440 utilize the second supply voltage. A portion of the blocks 450 and 460 also use the second supply voltage. In an embodiment, block 470 uses the first supply voltage. In various embodiments, block 470 receives the write data and the write mask data, and stores the received data in storage elements such as latches, registers or flip-flops. The stored data are sent from block 470 to the level shifters in blocks 450 and 460.

In an embodiment, redundancy logic is located in block 470, and write data and write mask data are shifted to another column before being level shifted by blocks 450 and 460. In another embodiment, block 440 includes redundancy logic for selecting which portions of incoming information is combined with other portions of the incoming information such as repair information for a failed column. In other embodiments, the redundancy logic is located in another block.

In an embodiment, block 440 includes combiners, which combines write data and write mask data. In some embodiments, the combiners combine write data and write mask data with Boolean AND logic on a bit-wide basis. The output values of the combiners are sent to write drivers, which send enabled write information to write columns 430A or write columns 430B based on which one of the arrays 410A-410B is being accessed. In some embodiments, write columns 430A-430B use dynamic logic, sense amplifiers, a write clock signal and timing control logic for setting up the write word line drivers and updating the write latches with new data.

Row decoders and column decoders are placed in blocks 430A-430B or another block. Row decoders select the row, or the memory line, to be accessed based on the received request address. Write data is driven from block 430A into array 410A and written into a portion of the selected row. Similarly, write data is driven from block 430B into array 410B and written into a portion of the selected row. In various embodiments, the column decoders select the portion being accessed in the selected row.

As described earlier, in some embodiments, the rows in arrays 410A-410B are larger than the width of the I/O data. Selection logic within arrays 410A-410B specify the portion with the selected row.

For read access requests, blocks 420A-420B are used to pre-charge the read lines routed to the arrays 410A-410B. Read latches and timing logic used for pre-charging and setting up sense amplifiers and read word line driver logic are placed in blocks 420A-420B or another block. In various embodiments, blocks 420A-420B and 430A-430B include logic for pre-charging bit lines as described earlier for storage and access logic as illustrated in FIGS. 1-2.

Figure 5:
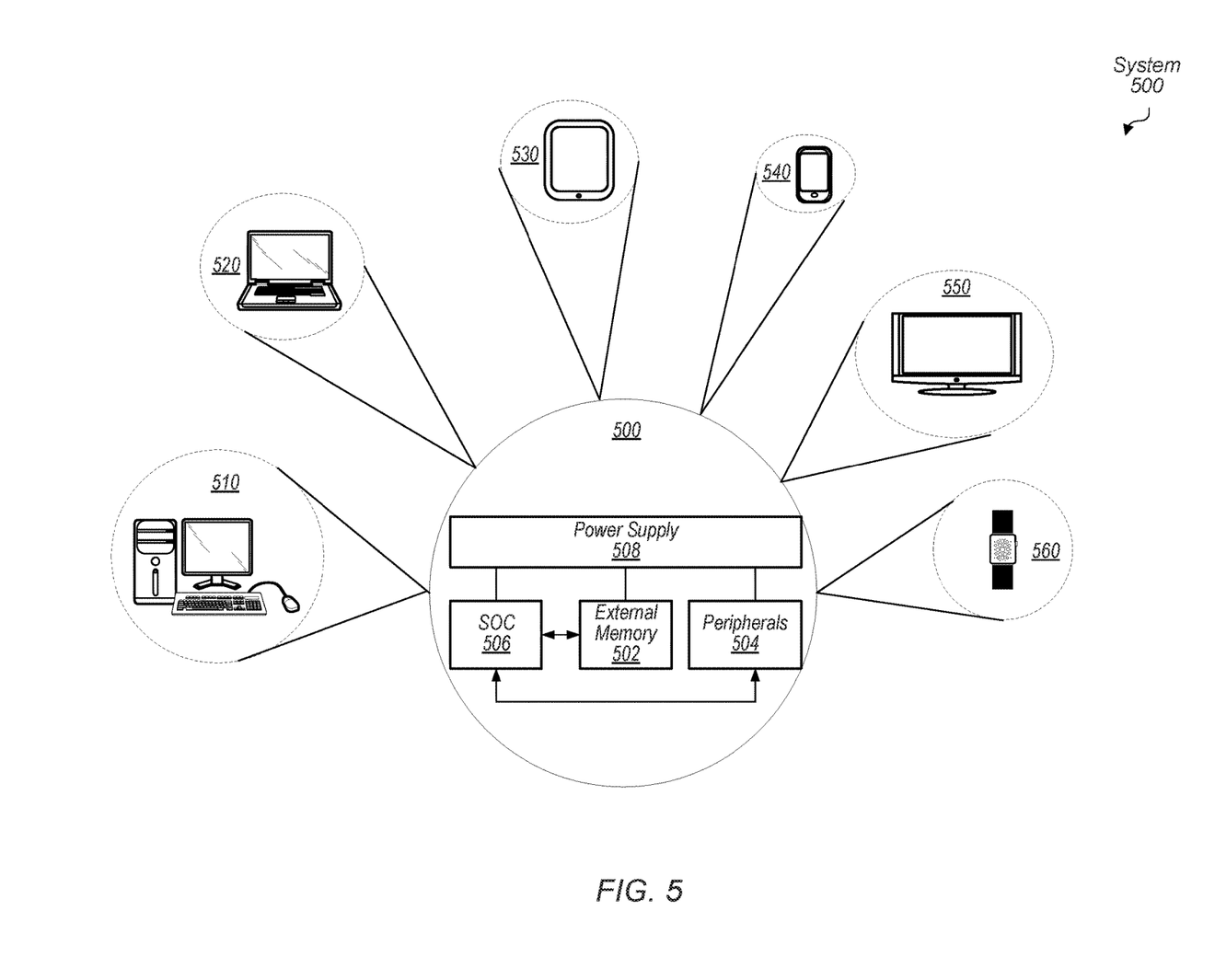
FIG. 5 is a block diagram of one embodiment of a system.

Turning next to FIG. 5, a block diagram of one embodiment of a system 500 is shown. As shown, system 500 represents chip, circuitry, components, etc., of a desktop computer 510, laptop computer 520, tablet computer 530, cell or mobile phone 540, television 550 (or set top box coupled to a television), wrist watch or other wearable item 560, or otherwise. Other devices are possible and are contemplated. In the illustrated embodiment, the system 500 includes at least one instance of a system on chip (SoC) 506 which includes multiple types of processing units, such as a central processing unit (CPU), a graphics processing unit (GPU), or other, a communication fabric, and interfaces to memories and input/output devices. In some embodiments, one or more processors in SoC 506 includes at least one instance of a processor which includes embedded memory. One or more of the processor and the embedded memory use multiple storage and access logic such as logic 100 (of FIG. 1) and logic 200 (of FIG. 2). In various embodiments, SoC 506 is coupled to external memory 502, peripherals 504, and power supply 508.

A power supply 508 is also provided which supplies the supply voltages to SoC 506 as well as one or more supply voltages to the memory 502 and/or the peripherals 504. In various embodiments, power supply 508 represents a battery (e.g., a rechargeable battery in a smart phone, laptop or tablet computer). In some embodiments, more than one instance of SoC 506 is included (and more than one external memory 502 is included as well).

The memory 502 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 504 include any desired circuitry, depending on the type of system 500. For example, in one embodiment, peripherals 504 includes devices for various types of wireless communication, such as Wi-Fi, Bluetooth, cellular, global positioning system, etc. In some embodiments, the peripherals 504 also include additional storage, including RAM storage, solid state storage, or disk storage. The peripherals 504 include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
   circuitry configured to:
      receive, by bit line charging circuitry, a first power supply voltage;
      receive, by each of a random access memory cell and the bit line charging circuitry, a second power supply voltage greater than the first power supply voltage;
      in response to determining completion of an access operation that accesses a first storage node that stores a ground reference voltage level:
         pre-charge, by the bit line charging circuitry, a first bit line corresponding to the first storage node to the first power supply voltage during a first time interval; and
         in response to determining the first time interval has elapsed, pre-charge, by the bit line charging circuitry, the first bit line from the first power supply voltage to the second power supply voltage during a second time interval.

2. The apparatus as recited in claim 1, wherein the circuitry further comprises a second storage node configured to store a voltage level corresponding to a binary logical inverse of the voltage level stored on the first storage node, and wherein in response to determining the access operation is a read operation, the circuitry is configured to:
   pre-charge a second bit line corresponding to the second storage node to the first power supply voltage during the first time interval; and
   in response to determining the first time interval has elapsed, pre-charge the second bit line from the first power supply voltage to the second power supply voltage during the second time interval.

3. The apparatus as recited in claim 2, wherein upon completion of the read operation, the first bit line stores a ground reference voltage level and the second bit line stores the second power supply voltage, or vice-versa.

4. The apparatus as recited in claim 1, wherein the circuitry further comprises a second storage node configured to store a voltage level corresponding to a binary logical inverse of the voltage level stored on the first storage node, and wherein in response to determining the access operation is a write operation, the circuitry is configured to determine from received write data that the first bit line discharged during the write operation.

5. The apparatus as recited in claim 4, wherein upon completion of the write operation, the circuitry is further configured to prevent pre-charging of the second bit line.

6. The apparatus as recited in claim 4, wherein the circuitry is further configured to:
   receive a third power supply voltage less than the first power supply voltage; and
   in response to determining completion of the write operation, pre-charge the first bit line from the third power supply voltage to a ground reference voltage level during a third time interval prior to the first time interval.

7. The apparatus as recited in claim 6, wherein the third power supply voltage is a negative power supply voltage.

8. The apparatus as recited in claim 1, wherein the circuitry is further configured to:
   enable a first device and disable a second device different from the first device when pre-charging the first bit line during the first time interval; and
   enable the second device and disable the first device when pre-charging the first bit line during the second time interval.

9. A method, comprising:
   receiving, by bit line charging circuitry, a first power supply voltage;
   receiving, by each of a random access memory cell and the bit line charging circuitry, a second power supply voltage greater than the first power supply voltage;
   in response to determining completion of an access operation that accesses a first storage node that stores a ground reference voltage level:
      pre-charging, by the bit line charging circuitry, a first bit line corresponding to the first storage node to the first power supply voltage during a first time interval; and
      in response to determining the first time interval has elapsed, pre-charging, by the bit line charging circuitry, the first bit line from the first power supply voltage to the second power supply voltage during a second time interval.

10. The method as recited in claim 9, further comprising:
    storing on a second node a voltage level corresponding to a binary logical inverse of the voltage level stored on the first storage node; and
    in response to determining the access operation is a read operation:
       pre-charging a second bit line corresponding to the second storage node to the first power supply voltage during the first time interval; and
       in response to determining the first time interval has elapsed, pre-charging the second bit line from the first power supply voltage to the second power supply voltage during the second time interval.

11. The method as recited in claim 10, wherein upon completion of the read operation, the first bit line stores a ground reference voltage level and the second bit line stores the second power supply voltage, or vice-versa.

12. The method as recited in claim 9, further comprising:
storing on a second storage node a voltage level corresponding to a binary logical inverse of the voltage level stored on the first storage node; and
in response to determining the access operation is a write operation, determining from received write data that the first bit line discharged during the write operation.

13. The method as recited in claim 12, wherein upon completion of the write operation, the method further comprises preventing pre-charging of the second bit line.

14. The method as recited in claim 12, further comprising:
receiving a third power supply voltage less than the first power supply voltage; and
in response to determining completion of the write operation, pre-charging the first bit line from the third power supply voltage to a ground reference voltage level during a third time interval prior to the first time interval.

15. The method as recited in claim 14, wherein the third power supply voltage is a negative power supply voltage.

16. The method as recited in claim 9, further comprising:
enabling a first device and disable a second device different from the first device when pre-charging the first bit line during the first time interval; and
enabling the second device and disable the first device when pre-charging the first bit line during the second time interval.

17. A memory comprising:
an array comprising a plurality of storage nodes, each configured to store data;
a plurality of row decoders, each configured to select a given memory line stored in the array based on a received request address, wherein each row decoder receives a first power supply voltage;
a plurality of column decoders, each configured to select a given bit line of a plurality of bit lines in the one or more arrays based on the received request address, wherein each column decoder receives the first power supply voltage;
wherein a first storage node in the array identified by each of a first row decoder and a first column decoder based on the received request address is configured to store a ground reference voltage level or a positive, non-zero voltage level using a second power supply voltage greater than the first power supply voltage; and
logic; and
in response to determining completion of an access operation that accesses the first storage node that stores a ground reference voltage level, the logic is configured to:
pre-charge a first bit line corresponding to the first storage node to the first power supply voltage during a first time interval; and
in response to determining the first time interval has elapsed, pre-charge the first bit line from the first power supply voltage to the second power supply voltage during a second time interval.

18. The memory as recited in claim 17, wherein the array further comprises a second storage node configured to store a voltage level corresponding to a binary logical inverse of the voltage level stored on the first storage node, and wherein in response to determining the access operation is a read operation, the logic is configured to:
pre-charge a second bit line corresponding to the second storage node to the first power supply voltage during the first time interval; and
in response to determining the first time interval has elapsed, pre-charge the second bit line from the first power supply voltage to the second power supply voltage during the second time interval.

19. The memory as recited in claim 17, wherein the array further comprises a second storage node configured to store a voltage level corresponding to a binary logical inverse of the voltage level stored on the first storage node, and wherein in response to determining the access operation is a write operation, the logic is configured to determine from received write data that the first bit line discharged during the write operation.

20. The memory as recited in claim 19, wherein the logic is further configured to:
receive a third power supply voltage less than the first power supply voltage; and
in response to determining completion of the write operation, pre-charge the first bit line from the third power supply voltage to a ground reference voltage level during a third time interval prior to the first time interval.

* * * * *